US009933688B1

(12) United States Patent
Shamee et al.

(10) Patent No.: US 9,933,688 B1
(45) Date of Patent: Apr. 3, 2018

(54) ANALOG-TO-DIGITAL CONVERTER USING A CONTINUOUS-WAVE LASER AND A TIMING REFERENCE DERIVED FROM A MULTIFREQUENCY OPTICAL SIGNAL

(71) Applicant: Raytheon Company, Waltham, MA (US)

(72) Inventors: Bishara Shamee, Playa Del Rey, CA (US); Steven R. Wilkinson, Stevenson Ranch, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/658,081

(22) Filed: Jul. 24, 2017

(51) Int. Cl.
*H03M 1/00* (2006.01)
*G02F 7/00* (2006.01)

(52) U.S. Cl.
CPC ...................... *G02F 7/00* (2013.01)

(58) Field of Classification Search
CPC ..... G02F 7/00; G02F 2001/212; H03M 1/001
USPC .................................. 341/137, 155
See application file for complete search history.

(56) References Cited

U.S. PATENT DOCUMENTS

| 4,694,276 A * | 9/1987 | Rastegar | G02F 7/00 |
| | | | 341/137 |
| 6,118,396 A * | 9/2000 | Song | H03M 1/1215 |
| | | | 250/200 |
| 6,661,361 B1 * | 12/2003 | Lewis | G01J 9/0246 |
| | | | 341/137 |
| 8,780,948 B2 | 7/2014 | Wilkinson et al. | |
| 8,787,767 B2 | 7/2014 | Wilkinson et al. | |
| 2008/0031633 A1 | 2/2008 | Hoshida et al. | |
| 2012/0280844 A1 | 11/2012 | Abe et al. | |
| 2013/0315597 A1 | 11/2013 | Shaver et al. | |
| 2016/0220709 A1 | 8/2016 | Olivo et al. | |

OTHER PUBLICATIONS

"U.S. Appl. No. 15/658,069, Non Final Office Action dated Nov. 1, 2017", 13 pgs.
Chen, Xu, et al., "Photonic-assisted time-interleaved ADC based on optical delay line", Journal of Optics 18, (2016), 1-6.
(Continued)

*Primary Examiner* — Khai M Nguyen
(74) *Attorney, Agent, or Firm* — Schwegman Lundberg & Woessner, P.A.

(57) ABSTRACT

An analog-to-digital converter can produce a digital signal representative of an analog input electrical signal. A continuous-wave laser can lock to a multifrequency optical signal and produce a continuous-wave optical signal. An optical amplitude modulator can modulate the continuous-wave optical signal using the analog input electrical signal to produce a first modulated optical signal. An optical splitter can split the first modulated optical signal into a plurality of modulated optical signals. A plurality of detectors can convert the modulated optical signals into respective modulated electrical signals. A plurality of comparators and a decoder arranged in a flash converter topology can receive the modulated electrical signals and output the digital signal using a timing reference derived from the multifrequency optical signal. Using a relatively high-precision multifrequency optical signal, such as produced by a photonic oscillator, can produce a relatively high-precision device.

20 Claims, 2 Drawing Sheets

(56) References Cited

OTHER PUBLICATIONS

Esman, Daniel, et al., "High Resolution Broadband Photonic Sampled ADC: 8.0 ENOB at 40 GHz", OECC/ACOFT, (2014), 189-191.
Grein, Matthew, et al., "Demonstration of a photonic analog-to-digital converter scalable to 40 GS/s with 8-bit resolution", CLEO/QELS, JWA90, (2008), 2 pgs.
Kewitsch, Anthony, et al., "All-fiber zero-insertion-loss add—drop filter for wavelength-division multiplexing", Optics Letters / vol. 23, No. 2, (1998), 106-108.
Khilo, Anatol, et al., "Photonic ADC: overcoming the bottleneck of electronic jitter", Optics Express, vol. 20, No. 4, (Feb. 13, 2012), 16 pgs.
Nakazawa, Masataka, et al., "1024 QAM (60 Gbps) single carrier coherent optical transmission over 150 km", Optics Express, vol. 20, No. 11, (May 21, 2012), 7 pgs.
Nejadmalayeri, Amir, et al., "A 16-fs aperture-jitter photonic ADC: 7.0 ENOB at 40 GHz", OSA/CLEO CThI4, (2011), 3 pgs.
Raybon, G, et al., "Single Carrier High Symbol Rate Transmitter for Data Rates up to 1 Tb/s", OFC, Th3A.2, (2016), 3 pgs.
Valley, George C, "Photonic analog-to-digital converters", Optics Express, vol. 15, No. 5, (2007), 28 pgs.
Yariv, A, et al., "Time Interleaved optical sampling for ultra-high speed A/D conversion", Electronic Letters, 8, vol. 34, No. 21, (Oct. 15, 199), 2012-2013.

\* cited by examiner

ANALOG-TO-DIGITAL CONVERTER USING A CONTINUOUS-WAVE LASER AND A TIMING REFERENCE DERIVED FROM A MULTIFREQUENCY OPTICAL SIGNAL

FIELD OF THE DISCLOSURE

The present disclosure relates to an analog-to-digital converter.

BACKGROUND OF THE DISCLOSURE

As communication systems evolve over time, digital data rate requirements tend to increase. As a result there is ongoing effort to improve the speed, accuracy, and bandwidth of analog-to-digital converters.

BRIEF DESCRIPTION OF THE DRAWINGS

Corresponding reference characters indicate corresponding parts throughout the several views. Elements in the drawings are not necessarily drawn to scale. The configurations shown in the drawings are merely examples, and should not be construed as limiting the scope of the invention in any manner.

DETAILED DESCRIPTION

A photonic oscillator can produce a stable multifrequency optical signal. In some example, the photonic oscillator can be locked to an atomic transition, which can ensure that the frequencies in the multifrequency optical signal remain stable over time. The multifrequency optical signal can be used to stabilize the wavelength of a continuous-wave laser. The multifrequency optical signal can also be used to produce a single-frequency electrical signal having a stable frequency.

The output from the continuous-wave laser and the single-frequency electrical signal can be used to produce an analog-to-digital converter having extremely high performance. Light from the continuous-wave laser can be modulated, amplified, split into multiple beams, and detected in a flash converter topology. Comparators in the flash converter topology can be triggered synchronously with a timing reference derived from the single-frequency electrical signal. Using the relatively high-performance photonic oscillator in such a manner can reduce jitter and phase noise impact on the analog-to-digital converter.

In a specific example, an analog-to-digital converter can produce a digital signal representative of an analog input electrical signal. A continuous-wave laser can lock to a multifrequency optical signal and produce a continuous-wave optical signal. An optical amplitude modulator can modulate the continuous-wave optical signal using the analog input electrical signal to produce a first modulated optical signal. An optical splitter can split the first modulated optical signal into a plurality of modulated optical signals. A plurality of detectors can convert the modulated optical signals into respective modulated electrical signals. A plurality of comparators and a decoder arranged in a flash converter topology can receive the modulated electrical signals and output the digital signal using a timing reference derived from the multifrequency optical signal. Using a relatively high-precision multifrequency optical signal, such as produced by a photonic oscillator, can produce a relatively high-precision device.

The preceding paragraph is but a summary of one example of an analog-to-digital converter, and is not intended to be limiting in any way. Other suitable examples are described in detail below.

Figure 1:
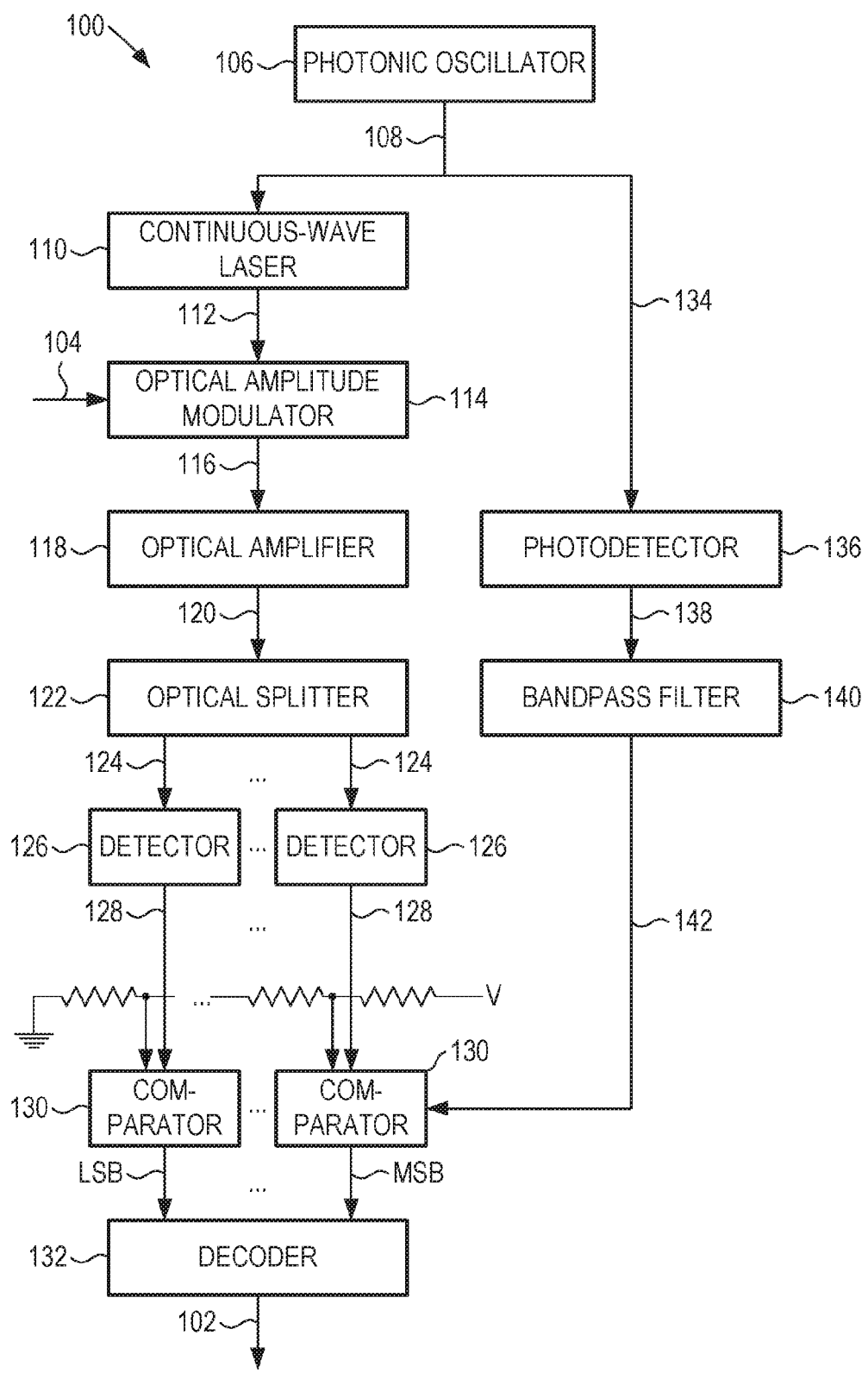
FIG. 1 shows a block diagram of an example of an analog-to-digital converter, in accordance with some examples.

FIG. 1 shows a block diagram of an example of an analog-to-digital converter 100 for producing a digital signal 102 representative of an analog input electrical signal 104, in accordance with some examples. FIG. 1 shows but one configuration of an analog-to-digital converter 100; other suitable configurations can also be used.

A photonic oscillator 106 can be configured to produce a multifrequency optical signal 108 having a spectrum that includes regularly spaced spectral lines. In some examples, the multifrequency optical signal 108 can be referred to as an optical comb. When viewed in the time domain, rather than the frequency domain, the multifrequency optical signal 108 can appear as a train of optical pulses. In some examples, the duration of the pulses can be on the order of one or a few femtoseconds, while the spacing between the pulses can be on the order of one or a few picoseconds. In a specific example, the multifrequency optical signal 108 can have a spectrum having regularly spaced spectral lines that extend across 200 THz with a spacing of 200 MHz. The 200 THz value can produce a pulse duration of about 5 femtoseconds. The 200 MHz value can produce a pulse-to-pulse spacing of about 5 nanoseconds. This is but one specific example, other suitable numerical values can also be used. In another specific example, the multifrequency optical signal 108 can have a spectrum having regularly spaced spectral lines that extend in a frequency range from 125 THz to 250 THz, with spacing of 200 MHz and above. These are but two numerical examples, and it will be understood that other suitable numerical values can also be used.

An example of a suitable photonic oscillator 106 is described in detail in U.S. Pat. No. 8,780,948 (hereinafter referred to as '948), titled "Precision photonic oscillator and method for generating an ultra-stable frequency reference using a two-photon rubidium transition", and issued on Jul. 15, 2014 to Wilkinson et al. The complete disclosure of U.S. Pat. No. 8,780,948 is incorporated by reference herein. Element 115 of the '948 patent, referred to in the '948 patent as a super-continuum of optical wavelengths, can be directed out of the system of the '948 patent by a suitably positioned beamsplitter, and is an example of a suitable multifrequency optical signal 108. A continuous-wave laser locked to the multifrequency optical signal 108 can have extremely narrow linewidth, such as having a linewidth between 1 Hz and 5 Hz, or, optionally, lower than 1 Hz. Such a narrow linewidth continuous-wave laser can produce signals having less than 10 femtoseconds of jitter, over a suitable bandwidth. Locking the continuous-wave laser to the multifrequency optical signal 108 can reduce the phase noise of the output, to the extent that the continuous-wave laser output can be used directly (e.g., without additional preparation circuitry) for applications that require relatively low phase noise, such as a clock for an analog-to-digital converter. Locking the continuous-wave laser in this manner can eliminate the need to use preparation circuitry, such as additional phase-locked loops, up/down conversions, or retiming. Reducing the required circuitry downstream can make the device of the '948 patent particularly well-suited for use in the analog-to-digital converter 100.

The output of the system of the '948 patent can include two quantities.

A first output quantity can be single-frequency electrical signal, which can be a periodic signal with a frequency (f) matched to a single line of the multifrequency optical signal 108. In some examples, the single-frequency electrical signal can have leading and/or trailing edges that have the same precision as the photonic oscillator 106. In the analog-to-digital converter 100 of FIG. 1, the timing reference 142 (discussed below) can correspond to this single-frequency electrical signal.

A second output quantity can be a continuous-wave optical signal, which can include laser light having constant power (e.g., not modulated over time), and having a wavelength (λ) that is locked to the photonic oscillator 106. In the analog-to-digital converter 100 of FIG. 1, continuous-wave optical signal 112 (discussed below) can correspond to the continuous-wave optical signal discussed in '948.

The output quantities of the system of the '948 patent can be directed as needed to downstream elements that can utilize a low-jitter electrical signal at a single frequency (f) and continuous-wave laser light having a well-controlled wavelength (λ). The device of the '948 patent is but one example of a suitable photonic oscillator 106; other suitable devices that produce high-precision multifrequency optical signals or high-precision optical combs can also be used. The multifrequency optical signal 108 can additionally form a timing reference 142, which is discussed in detail below.

A continuous-wave laser 110 can lock to the multifrequency optical signal 108. The continuous-wave laser 110 can produce a continuous-wave optical signal 112 at a specified wavelength in response to the multifrequency optical signal 108. In some examples, the continuous-wave laser 110 can lock directly to the multifrequency optical signal 108, without using preparation circuitry, such as additional phase-locked loops, up/down conversions, or retiming. In other examples, such preparation circuitry can additionally be used. In some examples, the continuous-wave laser 110 can include a servo system to lock a wavelength of the continuous-wave laser 110 to the multifrequency optical signal 108, so that the wavelength stabilizes based on a stability of the multifrequency optical signal 108. In some examples, the servo system can include a closed-loop feedback system. In some examples, the closed-loop feedback system can generate an electrical error signal that crosses zero when the wavelength of the continuous-wave laser 110 crosses a desired wavelength. In some examples, the closed-loop feedback system can vary a physical property, such as a voltage or a cavity length, in response to the error signal, to ensure that the wavelength of the continuous-wave laser 110 remains locked to the desired wavelength. In some examples, the continuous-wave laser 110 can have a wavelength between 1525 nm and 1625 nm, inclusive, which can include the C-band and L-band commonly used in optical fiber-based communication systems. In some examples, the continuous-wave laser 110 can have a wavelength corresponding to a specified channel in one of the C-band or L-band commonly used in optical fiber-based communication systems. Other wavelengths can also be used.

An optical amplitude modulator 114 can modulate the continuous-wave optical signal 112 using the analog input electrical signal 104 to produce a first modulated optical signal 116. In some examples, the optical amplitude modulator 114 includes a Mach-Zehnder interferometer configured such that the analog input electrical signal 104 operably modulates the optical signal 112. In some examples, a dual optical amplitude modulator can be used, which can be referred to as a nested Mach-Zehnder interferometer. Other suitable modulators can also be used.

In some examples, an optional optical amplifier 118 can amplify the first modulated optical signal 116 to form an amplified first modulated optical signal 120. In some examples, the optical amplifier 118 can be a semiconductor optical amplifier, which can pass current through a semiconductor gain medium to amplify light that passes through the optical amplifier 118. An optical amplifier 118 may have a larger bandwidth than a comparable all-electrical amplifier, which can be advantageous. Other suitable amplifiers can also be used.

An optical splitter 122 can split the first modulated optical signal 116 (or 120 if the optional optical amplifier 118 is present) into a plurality of modulated optical signals 124. In some examples, the optical splitter 122 can split the first modulated optical signal 116 or 120 into $2^n-1$ modulated optical signals 124, where n is a number of bits representing the digital signal 102. In some examples, n can be an integer greater than or equal to two, such as two, four, eight, twelve, sixteen, or another suitable value. In some examples, the modulated optical signals 124 are identical to one another, to within typical manufacturing tolerances for the optical splitter 122. The modulated optical signals 124 all have the same variation of amplitude over time as one another, and are in phase with one another (e.g., are synchronized to one another). Using $2^n-1$ modulated optical signals 124 can be compatible with a flash converter topology downstream, which is discussed in more detail below.

A plurality of detectors 126 can convert the modulated optical signals 124 into respective modulated electrical signals 128. In some examples, the detectors 126 can be photodiodes, which can convert light into current. Other suitable detectors 126 can also be used. In some examples, the plurality of modulated optical signals 124 are all copies of one another, the plurality of detectors 126 are all identical to one another (or as close as is practical using typical manufacturing tolerances), and the plurality of modulated electrical signals 128 all have the same variation in voltage and/or current over time as one another. In some examples, the plurality of detectors 126 can include $2^n-1$ detectors, where n is the number of bits for the digital signal 102.

A plurality of comparators 130 and a decoder 132 can be arranged in a flash converter topology. In a typical flash converter topology, an analog signal is applied simultaneously to each comparator, and each comparator has a different reference voltage on its other input, with the voltages ascending in voltage increments equivalent to one least significant bit. In some examples, the voltages applied to the comparators 130 in a flash converter topology can increase from the least significant bit (LSB) to the most significant bit (MSB). In some examples, including the example shown in FIG. 1, the reference voltages are provided by a chain of resistors connected in series, sometimes referred to as a resistor ladder. In these examples, the resistors are all identical to one another (or as close as is practical using typical manufacturing tolerances). In other configurations, the detectors can have a settable threshold without the resistors. In other configurations, the voltages can be provided by suitably connected capacitors. In some examples, the decoder 132 can employ thermometer code decoding, although other such decoding schemes can also be used. In some examples, the plurality of comparators 130 can include $2^n-1$ comparators, where n is the number of bits for the digital signal 102.

In some examples, the plurality of comparators 130 and the decoder 132 can receive the modulated electrical signals 128 and output the digital signal 102 representative of the analog input electrical signal 104 using a timing reference 142 derived from the multifrequency optical signal 108. In some examples, the comparators 130 can trigger comparisons synchronously with the timing reference 142. In some examples, the timing reference 142 can be a periodic electrical signal, such as a pulsed signal that corresponds to one frequency of the multifrequency optical signal 108.

In some examples, a photodetector 136 can convert the multifrequency optical signal 108, or a copy 134 of the multifrequency optical signal 108, to a multifrequency electrical signal 138. The multifrequency electrical signal 138 can have a spectrum that includes the regularly spaced spectral lines that are present in the multifrequency optical signal 108. In some examples, the photodetector 136 can have a response time fast enough to include an upper end of the spectral lines in the multifrequency optical signal 108. In some examples, the photodetector 136 can have a bandwidth large enough to include all or a selected portion of the spectral lines in the multifrequency optical signal 108.

In some examples, a bandpass filter 140 can attenuate all but a first spectral line of the spectrum of the multifrequency electrical signal 138 to form a single-frequency electrical signal at the frequency of the first spectral line. The single-frequency electrical signal can form the timing reference 142. In some examples, the bandpass filter 140 can select a single line (sometimes referred to as a tooth) from the optical comb. The frequency of the selected spectral line can correspond to a sample rate of the analog-to-digital converter 100.

In some examples, the analog-to-digital converter 100 can optionally include an additional fine delay in the optical path just before the optical amplifier 118, which can adjust for a manufacturing skew between a radiofrequency clock and a modulated signal.

Figure 2:
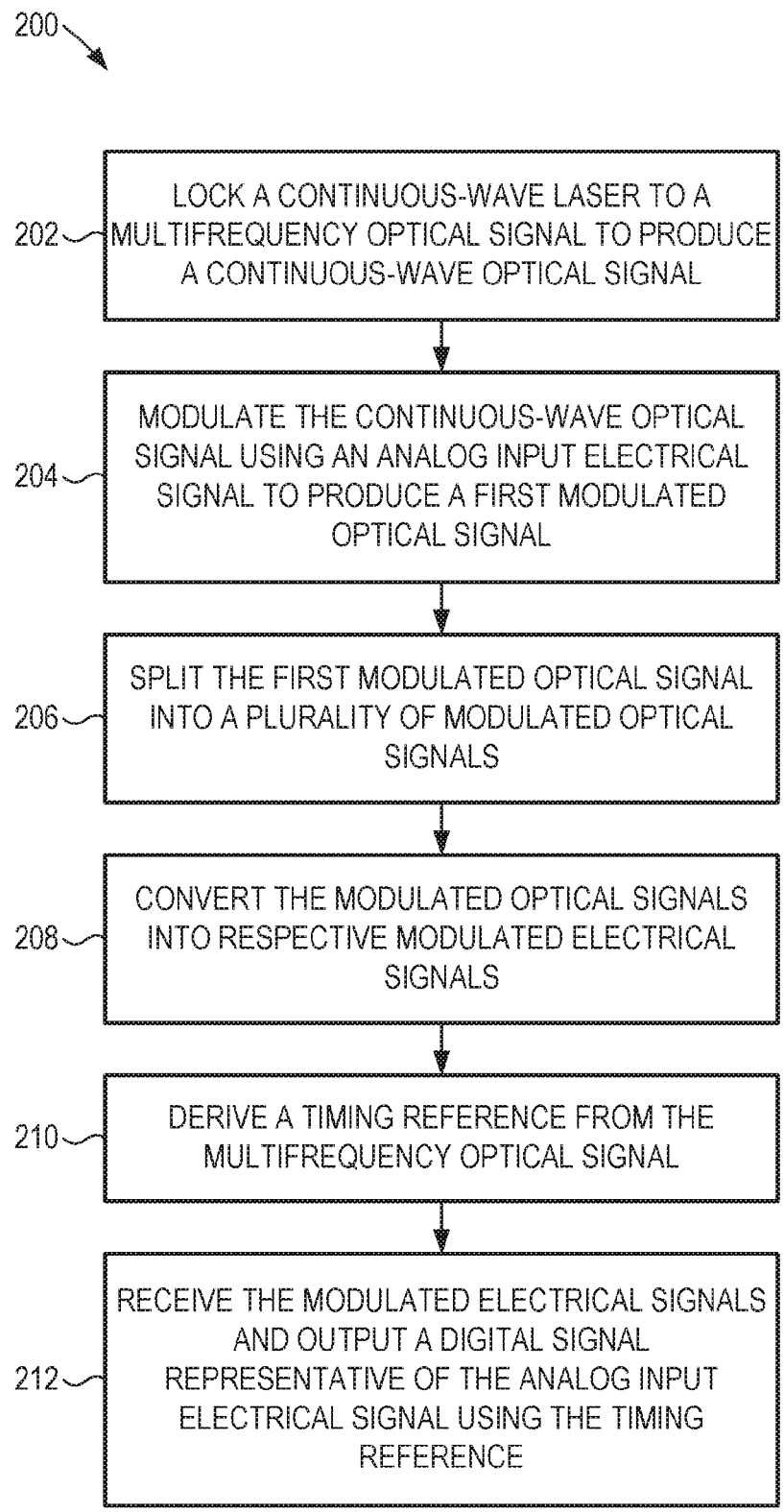
FIG. 2 shows a flowchart of a method for producing a digital signal representative of an analog input electrical signal, in accordance with some examples.

FIG. 2 shows a flowchart of a method 200 for producing a digital signal 102 representative of an analog input electrical signal 104, in accordance with some examples. The method can be executed by an analog-to-digital converter, such as 100 (FIG. 1). The method 200 of FIG. 2 is but one example of a method for producing a digital signal 102 representative of an analog input electrical signal 104; other suitable methods can also be used.

At operation 202, the analog-to-digital converter 100 can lock a continuous-wave laser to a multifrequency optical signal to produce a continuous-wave optical ignal.

At operation 204, an optical amplitude modulator, such as 114, can modulate the continuous-wave optical signal using an analog input electrical signal to produce a first modulated optical signal. In some examples, the modulation can include modulating the continuous-wave optical signal with a Mach-Zehnder interferometer. In some examples, the modulating can include modulating one arm of the Mach-Zehnder interferometer with the analog input electrical signal to produce the first modulated optical signal.

At operation 206, the analog-to-digital converter 100 can split the first modulated optical signal into a plurality of modulated optical signals.

At operation 208, the analog-to-digital converter 100 can convert the modulated optical signals into respective modulated electrical signals.

At operation 210, the analog-to-digital converter 100 can derive a timing reference from the multifrequency optical signal.

At operation 212, a plurality of comparators and a decoder arranged in a flash converter topology can receive the modulated electrical signals and output a digital signal representative of the analog input electrical signal using the timing reference. In some examples, the comparators can trigger comparisons synchronously with the timing reference.

In some examples, the method 200 can optionally further include producing the multifrequency optical signal with a photonic oscillator. The multifrequency optical signal can have a spectrum that includes regularly spaced spectral lines.

In some examples, the method 200 can optionally further include converting the multifrequency optical signal to a multifrequency electrical signal. The multifrequency electrical signal can have a spectrum that includes the regularly spaced spectral lines.

In some examples, the method 200 can optionally further include attenuating all but a first spectral line of the spectrum of the multifrequency electrical signal to form a single-frequency electrical signal at the frequency of the first spectral line. The single-frequency electrical signal can form the timing reference.

While this invention has been described as having example designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An analog-to-digital converter, comprising:
   a continuous-wave laser configured to lock to a multifrequency optical signal and produce a continuous-wave optical signal;
   an optical amplitude modulator configured to modulate the continuous-wave optical signal using an analog input electrical signal to produce a first modulated optical signal;
   an optical splitter configured to split the first modulated optical signal into a plurality of modulated optical signals;
   a plurality of detectors configured to convert the modulated optical signals into respective modulated electrical signals;
   a plurality of comparators and a decoder arranged in a flash converter topology, the plurality of comparators and the decoder configured to:
      generate, from the modulated electrical signals, a digital signal representative of the analog input electrical signal, using a timing reference derived from the multifrequency optical signal, and
      output the digital signal.

2. The analog-to-digital converter of claim 1, wherein the comparators are configured to trigger comparisons synchronously with the timing reference.

3. The analog-to-digital converter of claim 1, wherein the optical amplitude modulator is a Mach-Zehnder interferometer.

4. The analog-to-digital converter of claim 1, further comprising an optical amplifier configured to amplify the first modulated optical signal.

5. The analog-to-digital converter of claim 1, wherein the optical splitter is configured to split the first modulated optical signal into $2^n-1$ modulated optical signals, where n is a number of bits for the digital signal.

6. The analog-to-digital converter of claim 5, wherein:
the plurality of modulated optical signals includes $2^n-1$ modulated optical signals;
the plurality of detectors includes $2^n-1$ detectors; and
the plurality of comparators includes $2^n-1$ comparators.

7. The analog-to-digital converter of claim 1, further comprising a photonic oscillator configured to produce the multifrequency optical signal, the multifrequency optical signal having a spectrum that includes regularly spaced spectral lines.

8. The analog-to-digital converter of claim 7, further comprising a photodetector configured to convert the multifrequency optical signal to a multifrequency electrical signal, the multifrequency electrical signal having a spectrum that includes the regularly spaced spectral lines.

9. The analog-to-digital converter of claim 8, further comprising a bandpass filter configured to attenuate all but a first spectral line of the spectrum of the multifrequency electrical signal to form a single-frequency electrical signal at the frequency of the first spectral line, the single-frequency electrical signal forming the timing reference.

10. A method for producing a digital signal representative of an analog input electrical signal, the method comprising:
locking a continuous-wave laser to a multifrequency optical signal to produce a continuous-wave optical signal;
modulating the continuous-wave optical signal using an analog input electrical signal to produce a first modulated optical signal;
splitting the first modulated optical signal into a plurality of modulated optical signals;
converting the modulated optical signals into respective modulated electrical signals;
deriving a timing reference from the multifrequency optical signal;
with a plurality of comparators and a decoder arranged in a flash converter topology, generating from the modulated electrical signals a digital signal representative of the analog input electrical signal using the timing reference; and
outputting the digital signal.

11. The method of claim 10, further comprising triggering comparisons of the comparators synchronously with the timing reference.

12. The method of claim 10, wherein modulating the continuous-wave optical signal comprises:
modulating the continuous-wave optical signal with a Mach-Zehnder interferometer; and
modulating one arm of the Mach-Zehnder interferometer with the analog input electrical signal to produce the first modulated optical signal.

13. The method of claim 10, further comprising producing the multifrequency optical signal with a photonic oscillator, the multifrequency optical signal having a spectrum that includes regularly spaced spectral lines.

14. The method of claim 13, further comprising converting the multifrequency optical signal to a multifrequency electrical signal, the multifrequency electrical signal having a spectrum that includes the regularly spaced spectral lines.

15. The method of claim 14, further comprising attenuating all but a first spectral line of the spectrum of the multifrequency electrical signal to form a single-frequency electrical signal at the frequency of the first spectral line, the single-frequency electrical signal forming the timing reference.

16. An analog-to-digital converter, comprising:
a continuous-wave laser configured to lock to a multifrequency optical signal and produce a continuous-wave optical signal;
an optical amplitude modulator configured to modulate the continuous-wave optical signal using an analog input electrical signal to produce a first modulated optical signal;
an optical amplifier configured to amplify the first modulated optical signal;
an optical splitter configured to split the first modulated optical signal into $2^n-1$ modulated optical signals, where n is a number of bits for the digital signal;
a plurality of $2^n-1$ detectors configured to convert the modulated optical signals into respective modulated electrical signals;
a plurality of $2^n-1$ comparators and a decoder arranged in a flash converter topology, the plurality of comparators and the decoder configured to generate from the modulated electrical signals a digital signal representative of the analog input electrical signal using a timing reference derived from the multifrequency optical signal, the plurality of comparators configured to trigger comparisons synchronously with the timing reference.

17. The analog-to-digital converter of claim 16, further comprising a photonic oscillator configured to produce the multifrequency optical signal, the multifrequency optical signal having a spectrum that includes regularly spaced spectral lines.

18. The analog-to-digital converter of claim 17, further comprising a photodetector configured to convert the multifrequency optical signal to a multifrequency electrical signal, the multifrequency electrical signal having a spectrum that includes the regularly spaced spectral lines.

19. The analog-to-digital converter of claim 18, further comprising a bandpass filter configured to attenuate all but a first spectral line of the spectrum of the multifrequency electrical signal to form a single-frequency electrical signal at the frequency of the first spectral line, the single-frequency electrical signal forming the timing reference.

20. The analog-to-digital converter of claim 16, wherein the optical amplitude modulator is a Mach-Zehnder interferometer.

* * * * *

UNITED STATES PATENT AND TRADEMARK OFFICE
CERTIFICATE OF CORRECTION

PATENT NO. : 9,933,688 B1
APPLICATION NO. : 15/658081
DATED : April 3, 2018
INVENTOR(S) : Shamee et al.

Page 1 of 1

It is certified that error appears in the above-identified patent and that said Letters Patent is hereby corrected as shown below:

In the Specification

In Column 2, Line 32, delete "example," and insert --example;-- therefor

In Column 3, Line 21, delete "single frequency" and insert --single-frequency-- therefor In Column 3, Line 54, delete "C-hand and L-hand" and insert --C-band and L-band-- therefor In Column 5, Line 49, delete "ignal." and insert --signal.-- therefor Signed and Sealed this
Fourth Day of June, 2019

Andrei Iancu
*Director of the United States Patent and Trademark Office*